(12) United States Patent
Son

(10) Patent No.: US 9,620,221 B1
(45) Date of Patent: Apr. 11, 2017

(54) SEMICONDUCTOR MEMORY DEVICE AND OPERATING METHOD THEREOF

(71) Applicant: SK hynix Inc., Icheon-si Gyeonggi-do (KR)

(72) Inventor: Myeong Cheol Son, Cheongju-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/140,710

(22) Filed: Apr. 28, 2016

(30) Foreign Application Priority Data

Dec. 21, 2015 (KR) .................... 10-2015-0182887

(51) Int. Cl.
   *G11C 16/10* (2006.01)
   *G11C 16/04* (2006.01)
   *G11C 16/08* (2006.01)
   *G11C 16/26* (2006.01)

(52) U.S. Cl.
   CPC .......... *G11C 16/10* (2013.01); *G11C 16/0483* (2013.01); *G11C 16/08* (2013.01); *G11C 16/26* (2013.01)

(58) Field of Classification Search
   CPC ............................. G11C 16/10; G11C 16/08
   USPC ........................................ 365/185.05, 185.24
   See application file for complete search history.

(56) References Cited

U.S. PATENT DOCUMENTS

| 6,016,154 | A  | * | 1/2000  | Moroo ...................... G06K 9/44 345/428 |
| 6,807,104 | B2 | * | 10/2004 | Arai .................... G11C 16/0483 365/185.03 |
| 6,826,082 | B2 | * | 11/2004 | Hwang ................... G11C 7/065 365/185.17 |
| 6,992,934 | B1 | * | 1/2006  | Sarin ..................... G11C 11/5642 365/185.02 |
| 7,170,780 | B2 | * | 1/2007  | Kawai ................. G11C 11/5628 365/185.03 |
| 7,196,928 | B2 | * | 3/2007  | Chen .................... G11C 11/5642 365/185.09 |
| 7,233,522 | B2 | * | 6/2007  | Chen .................. G11C 16/0483 257/E21.663 |
| 7,286,408 | B1 | * | 10/2007 | Higashitani ........ G11C 16/3427 365/185.18 |
| 7,324,383 | B2 | * | 1/2008  | Incarnati ............ G11C 16/3404 365/185.18 |
| 7,672,166 | B2 | * | 3/2010  | Park ....................... G11C 16/24 365/185.01 |

(Continued)

FOREIGN PATENT DOCUMENTS

| KR | 1020120089987 A | 8/2012 |
| KR | 1020150029405 A | 3/2015 |

*Primary Examiner* — Michael Tran
(74) *Attorney, Agent, or Firm* — William Park & Associates Ltd.

(57) ABSTRACT

There may be provided a semiconductor memory device and an operating method thereof. A semiconductor memory device may include a memory cell array including a plurality of memory strings. The semiconductor memory device may include a peripheral circuit for performing a program operation on the plurality of memory strings, and a control logic for controlling the peripheral circuit to perform the program operation. The control logic may control the peripheral circuit to adjust potential levels of program permission voltages to be applied to the plurality of memory strings according to arrangement positions of the memory strings.

20 Claims, 8 Drawing Sheets

(56) References Cited

U.S. PATENT DOCUMENTS

| | | | | |
|---|---|---|---|---|
| 7,895,560 B2* | 2/2011 | Lovell | G06F 15/76 | 708/130 |
| 7,920,419 B2* | 4/2011 | Damle | G11C 16/0483 | 365/185.02 |
| 7,944,756 B2* | 5/2011 | Ueno | G11C 16/32 | 365/185.19 |
| 7,986,573 B2* | 7/2011 | Li | G11C 11/5628 | 365/185.11 |
| 8,848,446 B2* | 9/2014 | Iwai | G11C 11/5628 | 365/185.17 |
| 8,934,298 B2* | 1/2015 | Park | G11C 11/5628 | 365/185.02 |
| 8,947,939 B2* | 2/2015 | Tsai | G11C 16/0483 | 365/185.19 |
| 9,165,672 B2* | 10/2015 | Kang | G11C 7/1039 | |
| 9,466,345 B2* | 10/2016 | Choi | G11C 5/148 | |
| 9,478,304 B2* | 10/2016 | Park | G11C 16/3459 | |
| 9,484,097 B2* | 11/2016 | Kim | G11C 11/5628 | |
| 9,548,129 B2* | 1/2017 | Paudel | G11C 16/3427 | |
| 9,548,130 B2* | 1/2017 | Dutta | G11C 16/3459 | |
| 2004/0012998 A1* | 1/2004 | Chien | H01L 27/11524 | 365/185.2 |
| 2004/0124466 A1* | 7/2004 | Walker | H01L 27/11568 | 257/344 |
| 2004/0125629 A1* | 7/2004 | Scheuerlein | G11C 16/0483 | 365/17 |
| 2005/0162927 A1* | 7/2005 | Chien | H01L 27/11524 | 365/18 |
| 2005/0174852 A1* | 8/2005 | Hemink | G11C 16/10 | 365/185.28 |
| 2006/0198195 A1* | 9/2006 | Hemink | G11C 16/0483 | 365/185.18 |
| 2007/0047316 A1* | 3/2007 | Crippa | G11C 16/26 | 365/185.18 |
| 2007/0147118 A1* | 6/2007 | Pham | G11C 16/0483 | 365/185.17 |
| 2007/0147119 A1* | 6/2007 | Pham | G11C 16/0483 | 365/185.17 |
| 2007/0236992 A1* | 10/2007 | Oowada | G11C 16/0483 | 365/185.02 |
| 2007/0236993 A1* | 10/2007 | Oowada | G11C 16/0483 | 365/185.17 |
| 2007/0258276 A1* | 11/2007 | Higashitani | G11C 16/0483 | 365/10 |
| 2007/0291546 A1* | 12/2007 | Kamei | G11C 11/5628 | 365/185.22 |
| 2007/0291556 A1* | 12/2007 | Kamei | G11C 11/5628 | 365/189.09 |
| 2008/0062760 A1* | 3/2008 | Kim | G11C 11/5628 | 365/185.03 |
| 2008/0084754 A1* | 4/2008 | Mokhlesi | G11C 8/10 | 365/185.21 |
| 2008/0084755 A1* | 4/2008 | Mokhlesi | G11C 8/10 | 365/185.21 |
| 2008/0158949 A1* | 7/2008 | Mui | G11C 7/1006 | 365/185.03 |
| 2008/0158973 A1* | 7/2008 | Mui | G11C 7/1006 | 365/185.18 |
| 2008/0158984 A1* | 7/2008 | Mokhlesi | G11C 11/5642 | 365/185.21 |
| 2008/0158985 A1* | 7/2008 | Mokhlesi | G11C 11/5642 | 365/185.21 |
| 2008/0239830 A1* | 10/2008 | Lee | G11C 16/0483 | 365/185.29 |
| 2009/0244980 A1* | 10/2009 | Seol | G11C 16/10 | 365/185.22 |
| 2012/0195119 A1* | 8/2012 | Nagadomi | G11C 16/0483 | 365/185.03 |
| 2014/0091381 A1* | 4/2014 | Lee | G11C 29/04 | 257/314 |

* cited by examiner

SEMICONDUCTOR MEMORY DEVICE AND OPERATING METHOD THEREOF

CROSS-REFERENCE TO RELATED APPLICATION

The present application claims priority to Korean patent application number 10-2015-0182887 filed on Dec. 21, 2015 the entire disclosure of which is incorporated herein in its entirety by reference.

BACKGROUND

1. Technical Field

An aspect of the present disclosure generally relates to an electronic device, and more particularly, to a semiconductor memory device and an operating method thereof.

2. Related Art

Semiconductor devices, particularly, semiconductor memory devices are generally classified into volatile memory devices and nonvolatile memory devices.

A non-volatile memory device performs a read and write operation at a relatively low speed, but retains stored data even when a power supply is cut off. Accordingly, the non-volatile memory device is used to store data to be retained regardless of a power supply. Examples of the non-volatile memory device are a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. Flash memories are classified into NOR type flash memories and NAND type flash memories.

The flash memories have an advantage of a RAM in which data is freely programmed and erased, and an advantage of the ROM in which stored data is retained even when a power supply is cut off. The flash memories are widely used as a storage medium of portable electronic devices such as a digital camera, a personal digital assistant (PDA), and an MP3 player.

Program characteristics of a plurality of memory cells included in the flash memory may be different from each other. For example, since magnitudes of threshold voltages increasing according to the same program voltage are different from each other, fast cells programmed at fast speed and slow cells programmed at slow speed may exist in a program operation of the flash memory. The threshold voltage distribution width of the flash memory may be widened by the fast and slow cells.

SUMMARY

According to an aspect of the present disclosure, there may be provided a semiconductor memory device. The semiconductor memory device may include a memory cell array configured to include a plurality of memory strings. The semiconductor memory device may include a peripheral circuit configured to perform a program operation on the plurality of memory strings. The semiconductor memory device may include a control logic configured to control the peripheral circuit to perform the program operation. The control logic may control the peripheral circuit to adjust potential levels of program permission voltages to be applied to the plurality of memory strings according to arrangement positions of the memory strings. The program permission voltage applied to a memory string adjacent in a first direction among the plurality of memory strings may have a negative potential level.

According to an aspect of the present disclosure, there may be provided a method of operating a semiconductor memory device. The method may include providing a memory cell array including a plurality of memory strings. The method may include setting program permission voltages according to arrangement positions of the plurality of memory strings. The method may include applying the set program permission voltages and a program prohibition voltage to bit lines of the respective memory strings. The method may include applying a program voltage to a selected word line among a plurality of word lines connected to the plurality of memory strings. At least one of the program permission voltages may have negative potential levels.

According to an aspect of the present disclosure, there may be provided a semiconductor memory device. The semiconductor memory device may include a memory cell array configured to include a plurality of memory strings. The semiconductor memory device may include a peripheral circuit configured to perform a program operation on the plurality of memory strings. The semiconductor memory device may include a control logic configured to control the peripheral circuit to perform the program operation. The control logic may control the peripheral circuit to apply program permission voltages having negative potential levels to selected memory strings among the plurality of memory strings and to apply program prohibition voltages to unselected memory strings among the plurality of memory strings.

DETAILED DESCRIPTION

Figure 1:
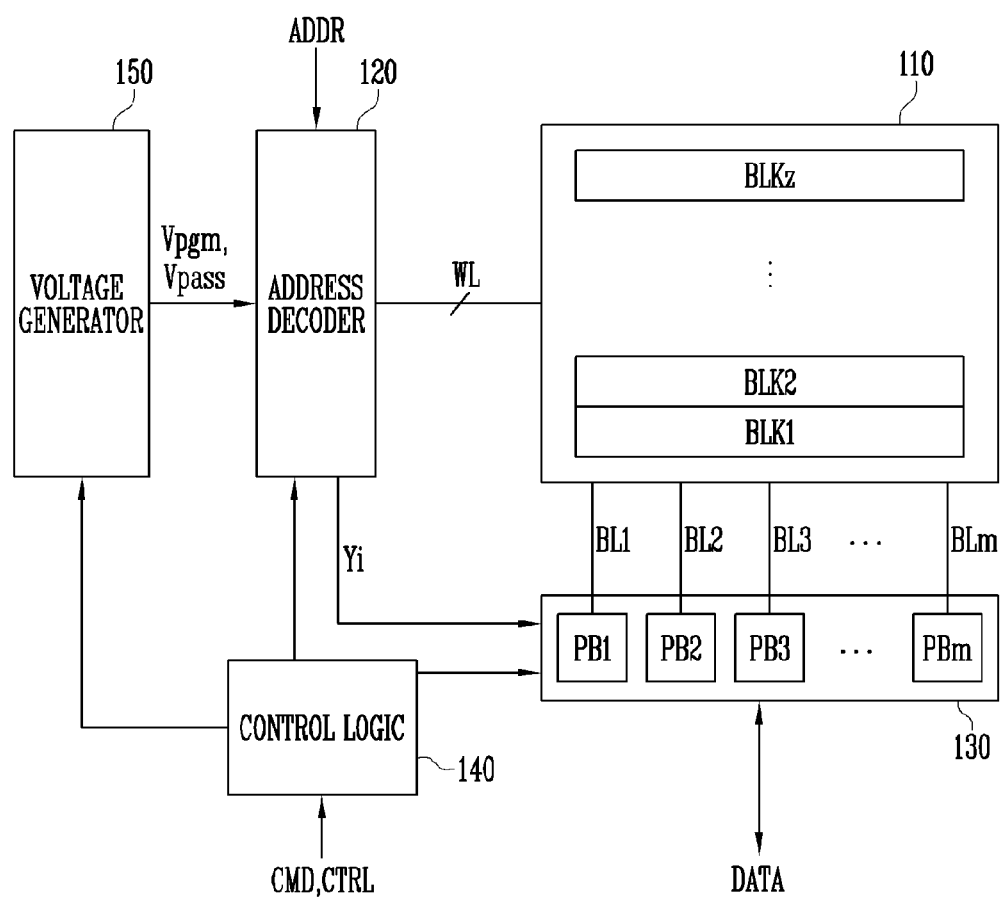
FIG. 1 is a block diagram illustrating a representation of an example of a semiconductor memory device according to an embodiment of the present disclosure.

Embodiments may provide a semiconductor memory device and an operating method thereof, which may control program speeds of memory cells to be equal in a program operation of the semiconductor memory device, thereby improving the threshold voltage distribution of the memory cells.

In the following detailed description, only certain examples of embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is a different disclosure.

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a block diagram illustrating a representation of an example of a semiconductor memory device according to an embodiment of the present disclosure.

Referring to FIG. 1, the semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read/write circuit 130 through bit lines BL1 to BLm. Each of the plurality of memory blocks BLK1 to BLKz includes a plurality of memory cells. As an embodiment, the plurality of memory cells may be nonvolatile memory cells. In the plurality of memory cells included in the memory cell array 110, memory cells connected to the same word line are defined as one page. That is, the memory cell array 110 is configured with a plurality of pages.

Each of the plurality of memory blocks BLK1 to BLKz in the memory cell array 110 includes a plurality of memory strings. The plurality of memory strings included in the memory cell array 110 have different distances from the address decoder 120 according to their arrangement positions, and therefore, the word lines connecting the address decoder 120 and the memory strings have different lengths. That is, a word line connecting the address decoder 120 and a memory string adjacent thereto has a shorter length than a word line connecting the address decoder 120 and a memory string distant therefrom. Thus, the memory strings correspond to different word line resistance values. Accordingly, although a program voltage is applied to the word lines in a program operation, the program speed of memory cells included in a memory string adjacent to the address decoder 120 is faster than the program speed of memory cells included in a memory string relatively distant from the address decoder 120.

Each of the plurality of memory strings includes a drain select transistor, a plurality of memory cells, and a source select transistor, which are connected in series between a bit line and a source line. Detailed description of the memory cell array 110 will be described later.

The address decoder 120, the read/write circuit 130, and the voltage generator 150 operate as peripheral circuits for driving the memory cell array 110.

The address decoder 120 is connected to the memory cell array 110 through the word lines WL. The address decoder 120 is configured to operate in response to control of the control logic 140. The address decoder 120 receives an address ADDR through an input/output buffer (not illustrated) inside the semiconductor memory device 100.

The address decoder 120 decodes a row address in a received address ADDR in a program operation, and applies a plurality of operation voltages including a program voltage Vpgm and a pass voltage Vpass, which are generated by the voltage generator 150, to the plurality of memory cells and the drain and source select transistors in the memory cell array 110 according to the decoded row address.

The address decoder 120 is configured to decode a column address in a received address ADDR in program and read operations. The address decoder 120 transmits the decoded column address Yi to the read/write circuit 130.

The received address ADDR in the program and read operations may include a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The plurality of page buffers PB1 to PBm are connected to the memory cell array 110 through the bit lines BL1 to BLm. Each of the plurality of page buffers PB1 to PBm controls the potential of a corresponding bit line among the bit lines BL1 to BLm according to data DATA to be programmed in a program voltage applying operation during a program operation. For example, when the data DATA to be programmed is first data (e.g., '0'), each of the plurality of page buffers PB1 to PBm applies a program permission voltage to a corresponding bit line (any one of BL1 to BLm). When the data DATA to be programmed is second data (e.g., '1'), each of the plurality of page buffers PB1 to PBm applies a program prohibition voltage to a corresponding bit line (any one of BL1 to BLm). For example, when the data DATA to be programmed is the first data, each of the plurality of page buffers PB1 to PBm applies the program permission voltage to the corresponding bit line (any one of BL1 to BLm). In this case, each of the plurality of page buffers PB1 to PBm applies the program permission voltage by adjusting the potential level of the program permission voltage according to the position of a memory string connected to the corresponding bit line. For example, when the memory string connected to the corresponding bit line is adjacent to the address decoder 120, the program permission voltage may have a positive voltage. When the memory string connected to the corresponding bit line is distant from the address decoder 120, the program permission voltage may have a negative voltage. That is, as the position of the memory string is more distant from the address decoder 120, the potential level of the program permission voltage is gradually decreased. The potential level of the program permission voltage ranges from a positive voltage level to a negative voltage level, which is lower than the program prohibition voltage.

The read/write circuit 130 operates in response to control of the control logic 140.

As an example of an embodiment, the read/write circuit 130 may include page buffers (or page registers), a column select circuit, and the like.

The control logic 140 is connected to the address decoder 120, the read/write circuit 130, and the voltage generator 150. The control logic 140 receives a command CMD and a control signal CTRL through the input/output buffer (not illustrated) inside the semiconductor memory device 100. The control logic 140 is configured to control overall operations of the semiconductor memory device 100 in response to the command CMD and the control signal CTRL. The control logic 140 controls the read/write circuit 130 to apply a program permission voltage or a program prohibition voltage to a corresponding bit line according to data to be programmed in a program operation. In this case, the control logic 140 controls page buffers applying the program prohibition voltage to apply different program prohibition voltages according to the position of a corresponding memory string.

The voltage generator 150 generates and outputs the program voltage Vpgm and the pass voltage Vpass in response to control of the control logic 130 during a program operation.

Figure 2:
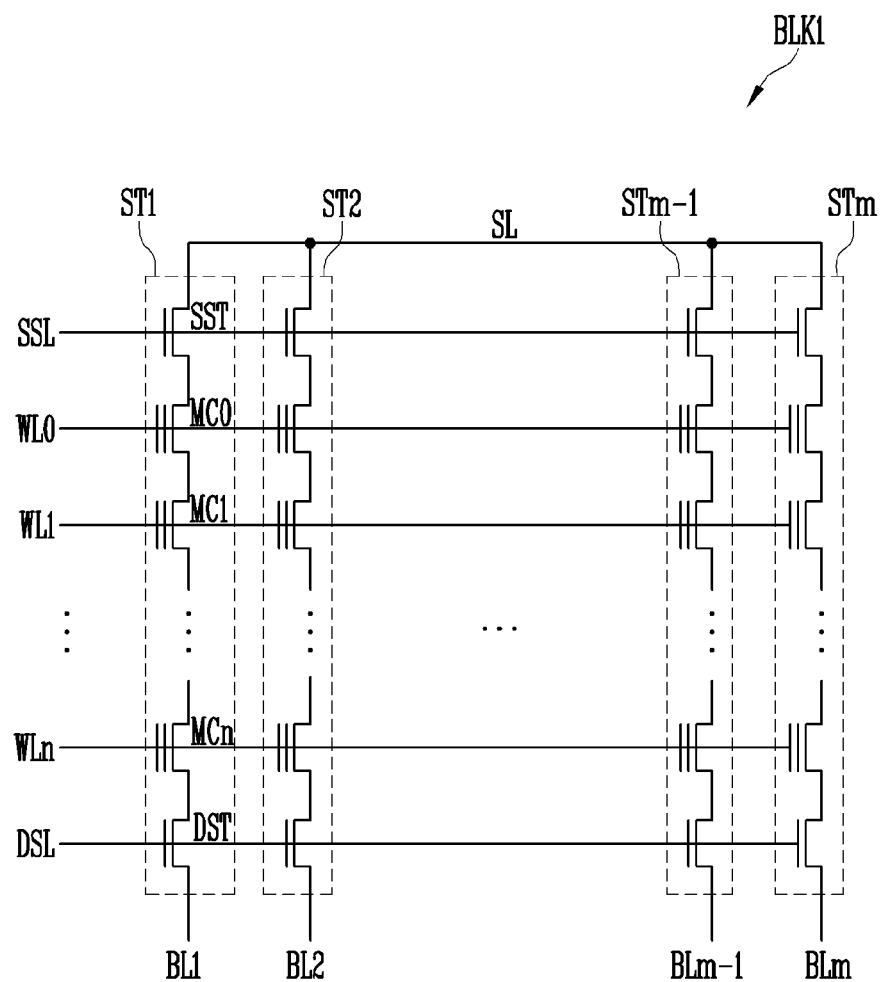
FIG. 2 is a circuit diagram illustrating a representation of an example of a memory block of FIG. 1.

FIG. 2 is a circuit diagram illustrating a representation of an example of one memory block BLK1 among the plurality of memory blocks illustrated in FIG. 1.

Referring to FIG. 2, the memory block BLK1 includes a plurality of cell strings ST1 to STm. Each of the plurality of cell strings ST1 to STm is connected to a plurality of bit lines BL1 to BLm.

Each of the memory strings ST1 to STm includes a source select transistor SST, a plurality of memory cells MC0 to MCn connected in series to each other, and a drain select transistor DST. The source select transistor SST is connected to a source select line SSL. The plurality of memory cells MC0 to MCn are connected to word lines WL0 to WLn, respectively. The drain select transistor DST is connected to a drain select line DSL. A source line SL is connected to a source of the source select transistor SST. Each of the bit lines BL1 to BLm is connected to a drain of a corresponding drain select transistor DST. The plurality of word lines described with reference to FIG. 1 includes the source select line SSL, the word lines WL0 to WLn, and the drain select line DSL. The source select line SSL, the word lines WL0 to WLn, and the drain select line DSL are driven by the address decoder 120. Although not illustrated in FIG. 1, the address decoder 120 may be disposed in one direction of the memory cell array 110. For example, the address decoder 120 may be disposed at a position adjacent to the memory string ST1. Thus, the memory string ST1 is adjacent to the address decoder 120, and hence the connection distance of the word lines WL0 to WLn to the memory string ST1 is short. On the other hand, the connection distance of the word lines WL0 to WLn to each of the memory strings ST2 to STm arranged in a direction opposite to that in which the address decoder 120 is disposed is gradually increased in the opposite direction.

Figure 3:
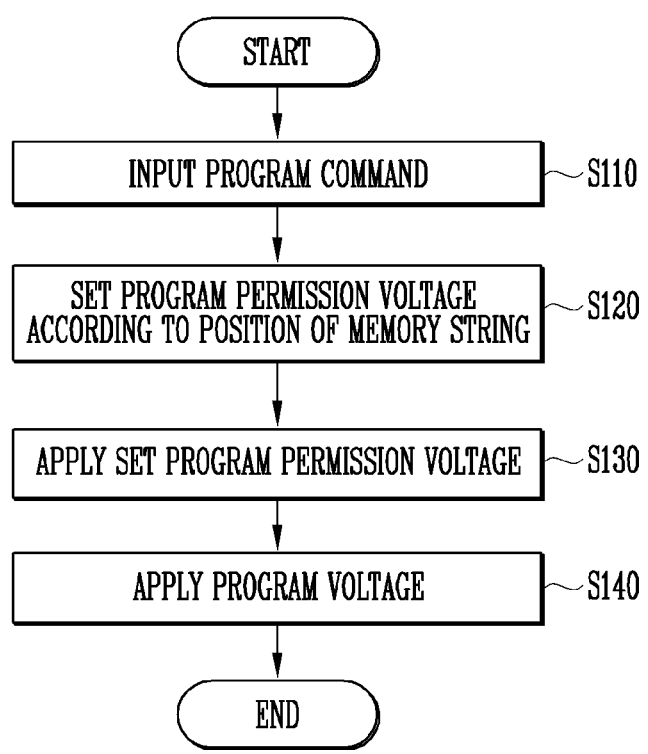
FIG. 3 is a flowchart illustrating a representation of an example of a program operation of the memory device according to an embodiment of the present disclosure.

FIG. 3 is a flowchart illustrating a representation of an example of a program operation of the memory device according to an embodiment of the present disclosure.

Figure 4:
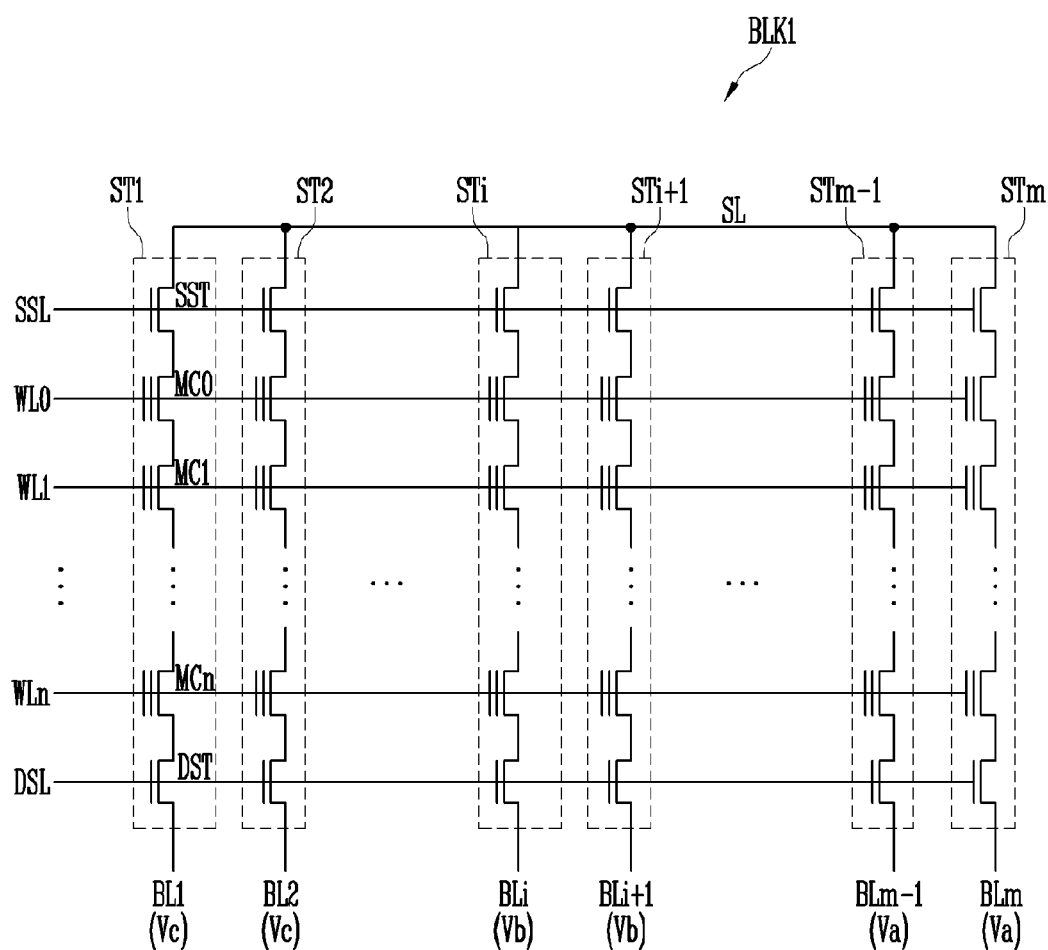
FIG. 4 is a diagram illustrating a representation of an example of a bit line voltage applying method according to an embodiment of the present disclosure.

FIG. 4 is a diagram illustrating a representation of an example of a bit line voltage applying method according to an embodiment of the present disclosure.

A program operation of the semiconductor memory device according to an embodiment of the present disclosure will be described as follows with reference to FIGS. 1 to 4.

1) Inputting a Program Command (S110)

If a command CMD for a program command and a control signal CTRL are input from the outside, the control logic 140 controls the peripheral circuits to perform a program operation of the semiconductor memory device. The read/write circuit 130 arbitrarily stores data DATA to be programmed, which is input from the outside.

2) Setting a Program Permission Voltage According to a Position of the Memory String (S120)

The plurality of page buffers PB1 to PBm included in the read/write circuit 130 set program permission voltages according to arrangement positions of the corresponding memory strings under control of the control logic 140. For example, the program permission voltage may be set to be lower than a program prohibition voltage. The program permission voltage may be set to become higher as the position of a memory string comes closer to the address decoder 120. The program prohibition voltage may be set to become lower as the position of a memory string becomes more distant from the address decoder 120. The program prohibition voltage may be set to have a negative voltage. As an example, in the plurality of memory strings ST1 to STm, adjacent memory strings may be defined as one group, and a program permission voltage set for each group may be applied. A first program prohibition voltage Va having a negative voltage may set to correspond to memory strings STm−1 and STm that are distant from the address decoder 120. A second program prohibition voltage Vb of 0V may be set to correspond to memory strings STi and STi+1 that are disposed at a central portion of the memory block. A third program prohibition voltage Vc having a positive voltage may be set to correspond to memory strings ST1 and ST2 that are close to the address decoder 120.

As another example, a third program prohibition voltage Vc of 0V may be set to correspond to memory strings ST1 and ST2 that are close to the address decoder 120. A second program prohibition voltage Vb having a negative voltage lower than the third program prohibition voltage Vc may be set to correspond to the memory strings STi and STi+1 that are disposed at the central portion of the memory block. A first program prohibition voltage Va having a negative voltage lower than the second program prohibition voltage Vb may be set to correspond to the memory strings STm−1 and STm that are distant from the address decoder 120.

In an above-described embodiment, the case where adjacent memory strings are defined as one group, and the program permission voltage set for each group is applied has been described as an example. However, different program permission voltages according to distances of the memory strings from the address decoder 120 may be set to correspond to the respective memory strings.

3) Applying a Set Program Permission Voltage (S130)

The plurality of page buffers PB1 to PBm included in the read/write circuit 130 apply the program prohibition voltage or the set program permission voltage Va, Vb, or Vc to corresponding bit lines BL1 to BLm according to the arbitrarily stored data to be programmed under control of the control logic 140.

4) Applying a Program Voltage (S140)

The voltage generator 150 generates a program voltage Vpgm to be applied to a selected word line and a pass voltage Vpass to be applied to unselected word lines. The voltage generator 150 generates an operation voltage to be applied to the drain select line DSL and the source select line SSL.

The address decoder 120 selects one word line in response to an address signal ADDR and applies, to the selected word line, the generated program voltage Vpgm by the voltage generator 150. In this state, the address decoder 120 applies the pass voltage Vpass to the other unselected word lines.

According to an embodiment of the present disclosure, memory strings connected to bit lines to which program permission voltages are applied have different potential levels of the program permission voltages applied to the bit lines according to their arrangement positions. For example, a relatively low program permission voltage is applied to memory strings distant from the address decoder 120, and thus a program speed generated according to the position of a memory string can be compensated by adjusting the program permission voltage applied to the bit lines. Accordingly, the plurality of memory strings have an equal program speed.

Figure 5:
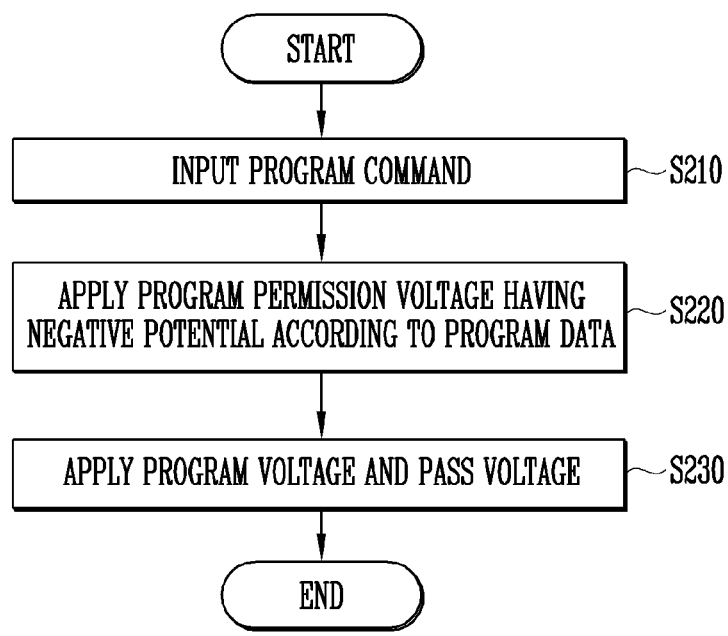
FIG. 5 is a flowchart illustrating a representation of an example of a program operation of the memory device according to an embodiment of the present disclosure.

FIG. 5 is a flowchart illustrating a representation of an example of a program operation of the memory device according to an embodiment of the present disclosure.

Figure 6:
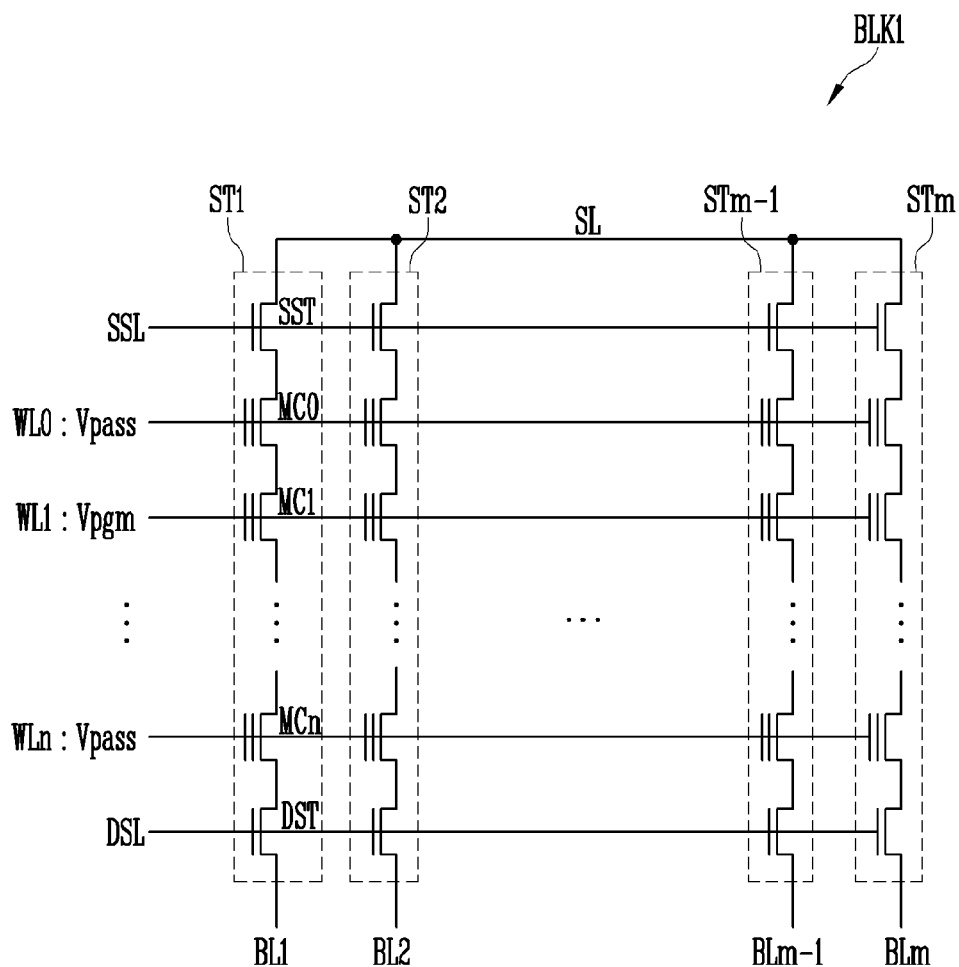
FIG. 6 is a diagram illustrating a representation of an example of a bit line voltage applying method according to an embodiment of the present disclosure.

FIG. 6 is a diagram illustrating a representation of an example of a bit line voltage applying method according to an embodiment of the present disclosure.

A program operation of the semiconductor memory device according to an embodiment of the present disclosure will be described as follows with reference to FIGS. 1, 2, 5, and 6.

1) Inputting a Program Command (S210)

If a command CMD for a program command and a control signal CTRL are input from the outside, the control logic 140 controls the peripheral circuits to perform a program operation of the semiconductor memory device. The read/write circuit 130 arbitrarily stores data DATA to be programmed, which is input from the outside.

2) Applying a Program Permission Voltage According to Program Data (S220)

The plurality of page buffers PB1 to PBm included in the read/write circuit 130 apply a program prohibition voltage or a set program permission voltage to the corresponding bit lines BL1 to BLm according to the arbitrarily stored data to be programmed under control of the control logic 140. Here, the program permission voltage has a negative potential level.

3) Applying a Program Voltage and a Pass Voltage (S230)

The voltage generator 150 generates a program voltage Vpgm to be applied to a selected word line and a pass voltage Vpass to be applied to unselected word lines. The voltage generator 150 generates an operation voltage to be applied to the drain select line DSL and the source select line SSL.

The address decoder 120 selects one word line (e.g., WL1) in response to an address signal ADDR and applies, to the selected word line, the program voltage Vpgm generated by the voltage generator 150. In this state, the address decoder 120 applies the pass voltage Vpass to the other unselected word lines.

The channel potential of selected memory cells in which first data is programmed among the memory cells MC1 connected to the selected word line WL1 to which the program voltage Vpgm is applied becomes a negative value of the program permission voltage applied to the bit line. Thus, the difference between the program voltage Vpgm applied to the selected memory cells and the channel potential of the selected memory cells can be adjusted according to the program permission voltage applied to the bit line. Accordingly, although the potential level of the program voltage Vpgm is decreased when the program permission voltage having a negative potential level is applied as compared with when the program permission voltage of 0V is applied, the same program effect can be obtained. When the program voltage Vpgm having a decreased potential level is applied, breakdown voltage (BV) characteristics can be improved, and the maximum output potential level of a pump circuit (not illustrated) for generating the program voltage Vpgm is also decreased. Thus, it may be possible to design the pump circuit such that the area of the pump circuit is decreased.

Further, the program permission voltage is applied with a negative potential level to the selected bit lines, and thus the potential level of the pass voltage applied to the word lines connected to the unselected memory cells can also be decreased and then applied.

As described above, according to an embodiment of the present disclosure, the program permission voltage is set and applied to have a negative potential level, so that the potential levels of the program voltage applied to the selected memory cell and the pass voltage applied to the unselected memory cells can be decreased and then applied. Accordingly, it may be possible to improve the BV characteristics and the design area of the pump circuit.

Figure 7:
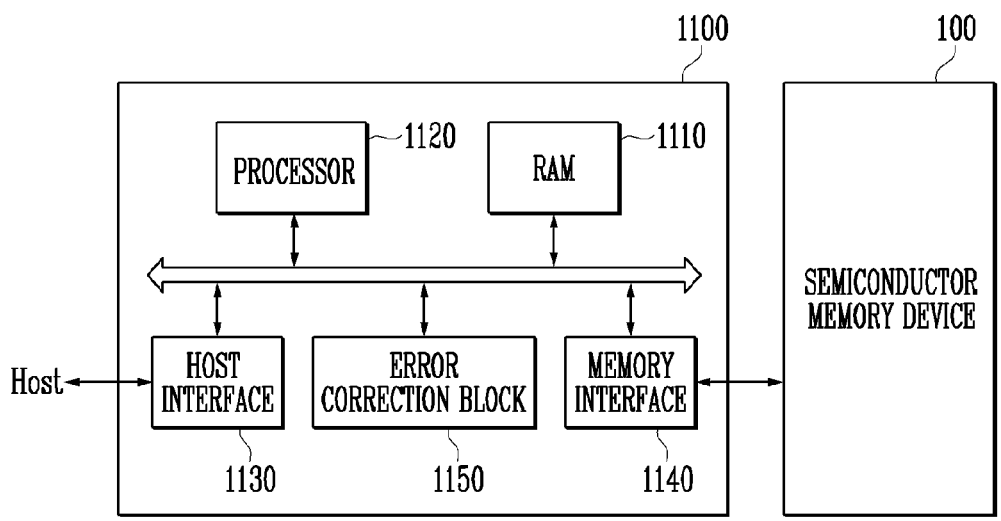
FIG. 7 is a block diagram illustrating a representation of an example of a memory system including the semiconductor memory device of FIG. 1.

FIG. 7 is a block diagram illustrating a representation of an example of a memory system including the semiconductor memory device of FIG. 1.

Referring to FIG. 7, the memory system 1000 includes a semiconductor memory device 100 and a controller 1100.

The semiconductor memory device 100 is identical to the semiconductor memory device described with reference to FIG. 1. Hereinafter, overlapping descriptions will be omitted.

The controller 1100 is connected to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processor 1120, a host interface 1130, a memory interface 1140, and an error correction block 1150. The RAM 1110 is used as at least one of an operation memory of the processor 1120, a cache memory between the semiconductor memory device 100 and the host Host, and a buffer memory between the semiconductor memory device 100 and the host Host. The processor 1120 controls overall operations of the controller 1100. Also, the controller 1100 may arbitrarily store program data provided from the host Host in a write operation.

The host interface 1130 includes a protocol for exchanging data between the host Host and the controller 1100. As an example of an embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correction block 1150 is configured to detect and correct an error of data received from the semiconductor memory device 100 by using an error correction code (ECC). The processor 1120 may control the semiconductor memory device 100 to adjust a read voltage, based on an error detection result of the error correction block 1150, and to perform re-reading. As an example of an embodiment, the error correction block 1150 may be provided as a component of the controller 1100.

The controller 1100 and the semiconductor memory device 100 may be integrated into one semiconductor device. As an example of an embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host connected to the memory system 1000 can be remarkably improved.

As an example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

As an example of an embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 8:
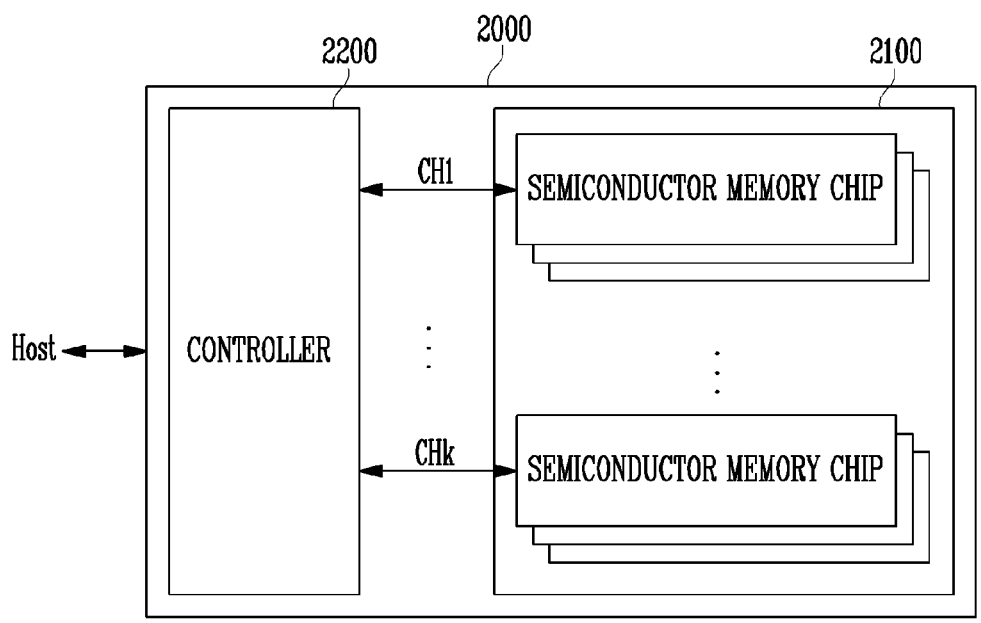
FIG. 8 is a block diagram illustrating a representation of an application example of the memory system of FIG. 7.

FIG. 8 is a block diagram illustrating a representation of an application example of the memory system of FIG. 7.

Referring to FIG. 8, the memory system 2000 includes a semiconductor memory device 2100 and a controller 2200. The semiconductor memory device 2100 includes a plurality of semiconductor memory chips. The plurality of semiconductor memory chips are divided into a plurality of groups.

Referring to FIG. 8, it is illustrated that the plurality of groups communicate with the controller 2200 through first to kth channels CH1 to CHk. Each semiconductor memory chip may be configured and operated like the semiconductor memory device 100 described with reference to FIG. 1.

Each group is configured to communicate with the controller 2200 through one common channel. The controller 2200 is configured similarly to the controller 1100 described with reference to FIG. 7. The controller 2200 is configured to control the plurality of memory chips of the semiconductor memory device 2100 through the plurality of channels CH1 to CHk.

Figure 9:
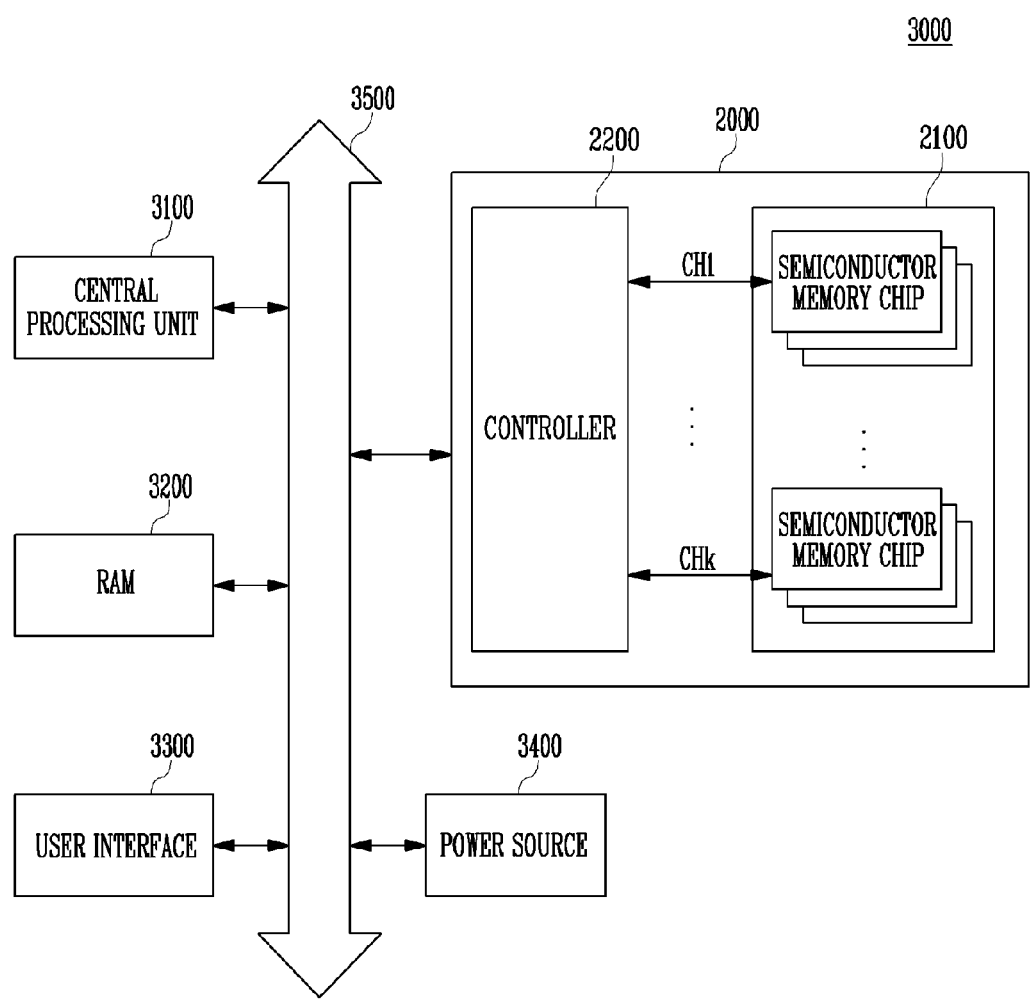
FIG. 9 is a block diagram illustrating a representation of an example of a computing system including the memory system described with reference to FIG. 8.

FIG. 9 is a block diagram illustrating a representation of an example of a computing system including the memory system described with reference to FIG. 8.

Referring to FIG. 9, the computing system 3000 includes a central processing unit 3100, a RAM 3200, a user interface 3300, a power source 3400, a system bus 3500, and a memory system 2000.

The memory system 2000 is electrically connected to the central processing unit 3100, the RAM 3200, the user interface 3300, and the power source 3400 through the system bus 3500. Data supplied through user interface 3300 or data processed by the central processing unit 3100 are stored in the memory system 2000.

Referring to FIG. 9, it is illustrated that the semiconductor memory device 2100 is connected to the system bus 3500 through the controller 2200. However, the semiconductor memory device 2100 may be directly connected to the system bus 3500. In this case, the function of the controller 2200 may be performed by the central processing unit 3100 and the RAM 3200.

Referring to FIG. 9, it is illustrated that the memory system 2000 described with reference to FIG. 6 is provided. However, the memory system 2000 may be replaced by the memory system 1000 described with reference to FIG. 7. As an example of an embodiment, the computing system 3000 may be configured to include both the memory systems 1000 and 2000 described with reference to FIGS. 7 and 8.

According to the present disclosure, program speeds of memory cells are controlled to be equal or substantially equal in a program operation of the semiconductor memory device, thereby improving the threshold voltage distribution of the memory cells.

Example of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device, comprising:
a memory cell array configured to include a plurality of memory strings;
a peripheral circuit configured to perform a program operation on the plurality of memory strings; and
a control logic configured to control the peripheral circuit to perform the program operation,
wherein the control logic controls the peripheral circuit to adjust potential levels of program permission voltages to be applied to bit lines of respective memory strings according to arrangement positions of the memory strings,
wherein the program permission voltage applied to a memory string adjacent in a first direction among the plurality of memory strings has a negative potential level.

2. The semiconductor memory device of claim 1, wherein the peripheral circuit includes an address decoder connected to the plurality of memory strings through a plurality of word lines,
wherein each of the plurality of memory strings is adjacent in the first direction as it becomes more distant from the address decoder, and is adjacent in a second direction as it becomes closer to the address decoder.

3. The semiconductor memory device of claim 2, wherein the peripheral circuit further includes a read/write circuit connected to the plurality of memory strings through the bit lines, the read/write circuit applying the program permission voltages to the bit lines.

4. The semiconductor memory device of claim 3, wherein the read/write circuit controls the program permission voltages applied to the bit lines of the memory strings adjacent in the second direction to have positive potential levels, and
wherein the read/write circuit controls the program permission voltages applied to the bit lines of the memory strings adjacent in the first direction to have negative potential levels.

5. The semiconductor memory device of claim 3, wherein the read/write circuit controls the program permission voltages applied to the bit lines of the memory strings adjacent in the second direction to have a potential level of 0V, and
wherein the read/write circuit controls the program permission voltages applied to the bit lines of the memory strings adjacent in the first direction to have negative potential levels.

6. The semiconductor memory device of claim 2, wherein the potential level of the program permission voltage is set to be gradually decreased in a order from the memory string adjacent in the second direction to the memory string adjacent in the first direction.

7. The semiconductor memory device of claim 2, wherein the potential level of the program permission voltage is set to be gradually decreased in an order from a memory string group adjacent in the second direction to a memory string group adjacent in the first direction, and
wherein the memory string groups include memory strings adjacent to each other.

8. The semiconductor memory device of claim 2, wherein the program permission voltage of 0V is applied to a central memory string disposed at a central portion of the memory cell array among the plurality of memory strings.

9. The semiconductor memory device of claim 8, wherein the program permission voltages having the negative potential levels are applied to memory strings disposed in the first direction from the central memory string among the plurality of memory strings.

10. The semiconductor memory device of claim 8, wherein the program permission voltages having the positive potential levels are applied to memory strings disposed in the second direction among the central memory string among the plurality of memory strings.

11. A method of operating a semiconductor memory device, the method comprising:
providing a memory cell array including a plurality of memory strings;
setting program permission voltages according to arrangement positions of the plurality of memory strings;
applying the set program permission voltages and a program prohibition voltage to bit lines of the respective memory strings; and
applying a program voltage to a selected word line among a plurality of word lines connected to the plurality of memory strings,
wherein at least one of the program permission voltages has a negative potential level.

12. The method of claim 11, wherein each of the plurality of memory strings is adjacent in a first direction as a memory string becomes more distant from an address decoder connected through word lines, and is adjacent in a second direction as the memory string becomes closer to the address decoder.

13. The method of claim 12, wherein, in the setting of the program permission voltages, the program permission voltages applied to the bit lines of the memory strings adjacent in the second direction are set to have positive potential levels, and
wherein, in the setting of the program permission voltages, the program permission voltages applied to the bit lines of the memory strings adjacent in the first direction are set to have negative potential levels.

14. The method of claim 12, wherein, in the setting of the program permission voltages, the program permission voltages applied to the bit lines of the memory strings adjacent in the second direction are set to have a potential level of 0V, and
wherein, in the setting of the program permission voltages, the program permission voltages applied to the bit lines of the memory strings adjacent in the first direction are set to have negative potential levels.

15. The method of claim 13, wherein, the setting of the program permission voltages, the potential level of the program permission voltage is set to be gradually decreased in a order from the memory string adjacent in the second direction to the memory string adjacent in the first direction.

16. The method of claim 13, wherein, the setting of the program permission voltages, the potential level of the program permission voltage is set to be gradually decreased in an order from a memory string group adjacent in the second direction to a memory string group adjacent in the first direction, and
wherein the memory string groups include memory strings adjacent to each other.

17. The method of claim 13, wherein, the setting of the program permission voltages, the program permission voltage of 0V is set to be applied to a central memory string disposed at a central portion of the memory cell array among the plurality of memory strings.

18. The method of claim 17, wherein, the setting of the program permission voltages, the program permission voltages having the negative potential levels are set to be applied to memory strings disposed in the first direction from the central memory string among the plurality of memory strings.

19. The method of claim 17, wherein, the setting of the program permission voltages, the program permission voltages having the positive potential levels are set to be applied to memory strings disposed in the second direction among the central memory string among the plurality of memory strings.

20. A semiconductor memory device, comprising:
- a memory cell array configured to include a plurality of memory strings;
- a peripheral circuit configured to perform a program operation on the plurality of memory strings; and
- a control logic configured to control the peripheral circuit to perform the program operation,
- wherein the control logic controls the peripheral circuit to apply program permission voltages having negative potential levels to bit lines of selected memory strings among the plurality of memory strings and to apply program prohibition voltages to bit lines of unselected memory strings among the plurality of memory strings.

* * * * *